United States Patent [19]

Kirsch

[11] Patent Number: 4,669,063
[45] Date of Patent: May 26, 1987

[54] SENSE AMPLIFIER FOR A DYNAMIC RAM
[75] Inventor: Howard C. Kirsch, Emmaus, Pa.
[73] Assignee: Thomson Components-Mostek Corp., Carrollton, Tex.
[21] Appl. No.: 454,754
[22] Filed: Dec. 30, 1982
[51] Int. Cl.⁴ .............................................. G11C 7/00
[52] U.S. Cl. ................................... 365/189; 365/210; 365/149; 365/203
[58] Field of Search ............... 365/189, 205, 207, 208, 365/149, 210, 104, 103, 204, 203, 226; 307/530

[56] References Cited

U.S. PATENT DOCUMENTS

| | | | |
|---|---|---|---|
| 3,789,312 | 1/1974 | Heller et al. | 307/530 |
| 3,983,545 | 9/1976 | Cordaro | 307/530 |
| 4,003,034 | 1/1977 | Au | 365/189 |
| 4,270,190 | 5/1981 | Jindra et al. | 365/205 |
| 4,414,547 | 11/1983 | Knapp et al. | 365/203 |
| 4,449,203 | 5/1984 | Adlhoch | 365/104 |
| 4,460,985 | 7/1984 | Hoffman | 307/530 |
| 4,057,789 | 1/1977 | Spadavecchia et al. | 365/189 |

Primary Examiner—James W. Moffitt
Assistant Examiner—Glenn A. Gossage
Attorney, Agent, or Firm—Roland Plottel

[57] ABSTRACT

A single ended sense amplifier (10) receives a bit line signal (16) at the gate of a detector MOS transistor (36). The source of the detector transistor (36) is connected to a reference voltage (24) which is adjusted prior to each memory cycle to make the gate to source voltage of the detector transistor (36) equal to the approximate threshold voltage of the transistor. The drain of the detector transistor (36) gates an amplifier transistor (30) which inhibits or passes a read signal (18) to the gate of a digit line pull down transistor (32) which provides an active pull down on a digit line (26) that is precharged to a high voltage prior to a memory read cycle.

13 Claims, 4 Drawing Figures

SENSE AMPLIFIER FOR A DYNAMIC RAM

TECHNICAL FIELD

This application relates to the field of very large scale integration (VLSI) semiconductor memories, and in particular to sense amplifiers for dynamic random access memories.

BACKGROUND OF THE INVENTION

Dynamic Random Access Memories (DRAMs), because of their single transistor/single capacitor per cell structure, are on the forefront of memory density and capacity in spite of inherent disadvantages which are well known in the art. For example the single transistor/single capacitor structure is characterized by a relatively weak storage signal, in addition to the obvious requirement for periodic refreshing of the memory cell capacitor.

Special circuits have been developed in the past to compensate for this relatively weak storage signal. The most common circuitry for sensing the signals stored in the capacitor of the cell has been a differential cross-coupled amplifier situated between two halves of a bit line. In this circuit the signal on the cell capacitor is sensed by first coupling the cell capacitor to one of the half bit lines to equilibrate the cell capacitance voltage and the bit line voltage. Next, the sense amplifier detects and amplifies this voltage imbalance in the two bit line halves. The capacitance and charge of the memory cell is very slight in comparison to the bit line itself, since the bit lines have many times more parasitic capacitance than the capacitance of the memory cell. Therefore, the signal is very small. After the signal is sensed, the memory capacitor is either recharged to a high voltage or completely discharged depending on the polarity of the signal to be stored.

More specifically, the sense amplifier generally uses two matched cross-coupled field effect transistors (FETs), with the drain of each FET connected to one half of the bit line and also to the gate of the other FET. The sources of the two FETs are common and attached to a latch signal line. Sensing occurs by initially placing a voltage on the bit line, which is greater than the threshold voltage of the two FETs. Next, the selected memory cell is connected to one of the bit line halves to create an imbalance in the voltage of the two bit lines halves. Because of the voltage difference between the two half bits lines, as the latch signal line is pulled downward one of the cross coupled FET's (the one with the higher gate voltage) begins to become conductive. This starts to discharge the bit line at the lower voltage and prevents the other FET from conducting. As the latch signal line is pulled to the ground potential, the lower potential bit line follows to ground while the higher potential bit line remains where it began. In this manner a full logic level difference can eventually be developed between the bit line halves.

Of particular importance with regard to the invention disclosed below is the necessity to precharge the bit line halves to a voltage greater than the threshold voltage of the FETs. In practice, the precharge is much higher than the threshold voltages for several reasons not directly related to the operation of the two cross-coupled FETs. However, this precharge to a relatively high voltage takes precious time and also produces several problems which adversely affect the cycle time and signal margins of the memory.

For example, the bit lines are precharged by FET transistors which exhibit a lower and more uniform onresistance when the gate-to-source voltage is relatively large. However, as the bit lines approach the supply voltage of the memory, the gate-to source voltage of the precharged FETs decreases, causing the bit line voltage to rise at a decreasing rate, thereby necessitating a relatively long precharge operation to insure uniform precharge voltages. Moreover, the final precharge voltage differential between the two bit line halves is determined by the characteristics of the precharge transistors when they have a relatively small gate-to-source voltage, as compared to two FETs which operate at a greater gate-to-source voltage.

Although the above described sense amplifier is sensitive to small changes in the bit line voltage, its output is relatively slow to develop and is generally used with another amplifier to speed the process of developing full logic levels. However, the scond sense amplifier cannot be coupled to the first sense amplifier during the sensing operation of the first amplifier, and thus there is the added time delay required by the second sense amplifier before a logic level is present on the digit line.

Therefore it can be appreciated that a dynamic random access memory sense amplifier which provides a rapid and accurate precharge and which provides for a faster overall memory access time is highly desirable.

SUMMARY OF THE INVENTION

It is therefore an object of this invention to provide a dynamic random access memory sense amplifier which permits a relatively rapid memory cycle operation.

It is also an object of the present invention to provide a dynamic random access memory sense amplifier which precharges rapidly and predictably.

Shown in an illustrated embodiment of the invention is an apparatus for sensing data in a memory cell. A first conductive path is connected to a plurality of memory cells. The conductive path is precharged by precharging circuitry to a predetermined voltage level, and threshold detecting circuitry connected to the conductive path provides an output signal in response to the voltage appearing on the conductive path. A switching circuit connected to the threshold detector passes or inhibits a read signal in response to the output of the threshold detector, and another switching circuit coupled to a digit line provides either a low impedance or a high impedance between the digit line and a reference in response to the output of the first switching circuitry.

Also shown in an illustrated embodiment of the invention is an apparatus for sensing and amplifying the voltage produced by a memory cell which includes an input terminal which receives a signal from the memory cell connected to a circuit in the apparatus for detecting this signal from the memory cell. The circuit for detecting the signal is responsive to a reference voltage, and this reference voltage is in turn determined in part by the same detection circuit.

Also in accordance with this invention is a method for sensing the data stored in a memory cell which includes first precharging a bit line coupled to the memory cell to a voltage potential and then enabling the memory cell to permit transfer of the charge between the bit line and the capacitor in the memory cell. Next the signal on the bit line is amplified with a single transistor which in turn either essentially discharges or leaves essentially charged a precharged node. Finally a second node is charged or left uncharged in response to the charge level in the precharged node.

BRIEF DESCRIPTION OF THE DRAWINGS

The aforementioned and other features, characteristics, advantages, and the invention in general, will be better understood from the following more detailed description taken in conjunction with the accompanying drawings in which.

Figure 1:
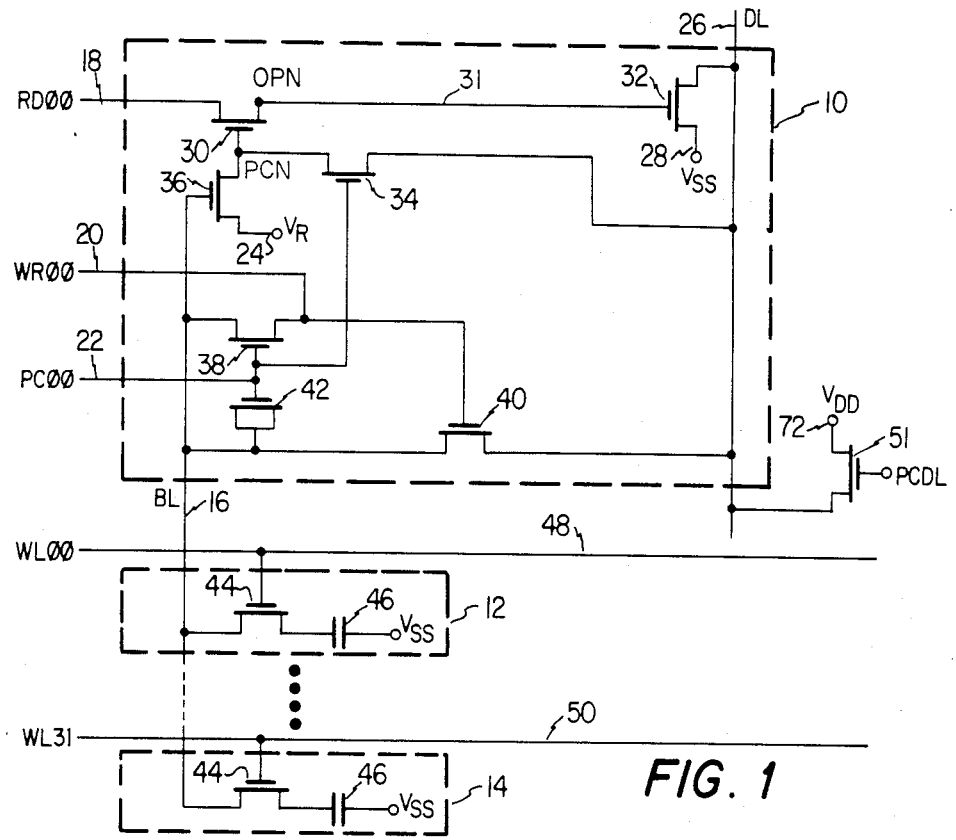
FIG. 1 is a schematic diagram of the sense amplifier in accordance with the present invention.

It will be appreciated that for simplicity and clarity of explanation and where considered appropriate, reference numerals have been repeated in more than one figure to indicate corresponding features.

DETAILED DESCRIPTION

Referring now to the drawings, a sense amplifier according to the present invention is shown in block 10 of FIG. 1. Also shown in FIG. 1 are two memory cells, 12 and 14, which are two of thirty-two memory cells in the preferred embodiment of the invention. Coupled between sense amplifier 10 and memory cells 12 and 14 is a bit line, BL, 16. Also connected to sense amplifier 10 is a read line, RD00, 18, a write line, WR00, 20, a precharge line, PC00, 22, a reference voltage line, VR, 24, a digit line DL, 26 and a supply voltage, VSS, 28. In the preferred embodiment VSS is at ground potential.

Inside sense amplifier 10 is an amplifier transistor 30, the source of which is connected to read line 18. A digit line transistor 32 has its gate connected to the drain of amplifier transistor 30, its drain connected to digit line 26, and its source connected to VSS. Connected between the gate of amplifier transistor 30 and digit line 26 is a first precharge transistor 34. The source of precharge transistor 34 is connected to the digit line 26 and the drain of precharge transistor 34 is connected to the gate of amplifier transistor 30 as is the drain of a detector transistor 36. The gate of detector transistor 36 is connected to bit line 16 and the source of detector transistor 36 is connected to reference voltage VR on line 24. Bit line 16 is also connected to the sources of two additional transistors, a second precharge transistor 38 and a write transistor 40. The drain of precharge transistor 38 is connected to the gate of write transistor 40 and also to the write input WR00 on line 20. The gate of precharge transistor 38 is connected to the PC00 input 22, to the gate of precharge transistor 34, and to the gate of a capacitor transistor 42. The drain of write transistor 40 is connected to the digit line 26. The source and drain of capacitor transistor 42 are connected together and to bit line 16. Thus capacitor transistor 42 is configured as a capacitor between the precharged line 22 and bit line 16.

Each of the memory cells 12 and 14 is comprised of an access transistor 44 and a storage capacitor 46. The drain of access transistor 44 is connected to bit line 16 while the source is connected to one place of capacitor 46, the other plate being connected to supply voltage VSS. The gates of transistors 44 are connected to word lines WL00 on line 48 and WL31 on line 50 respectively for the two memory cells 12 and 14.

Also shown in FIG. 1 is a precharge transistor 51 having a drain connected to VDD, a gate connected to a precharge signal $PC_{DL}$ and a source connected to digit line 26.

Figure 2:
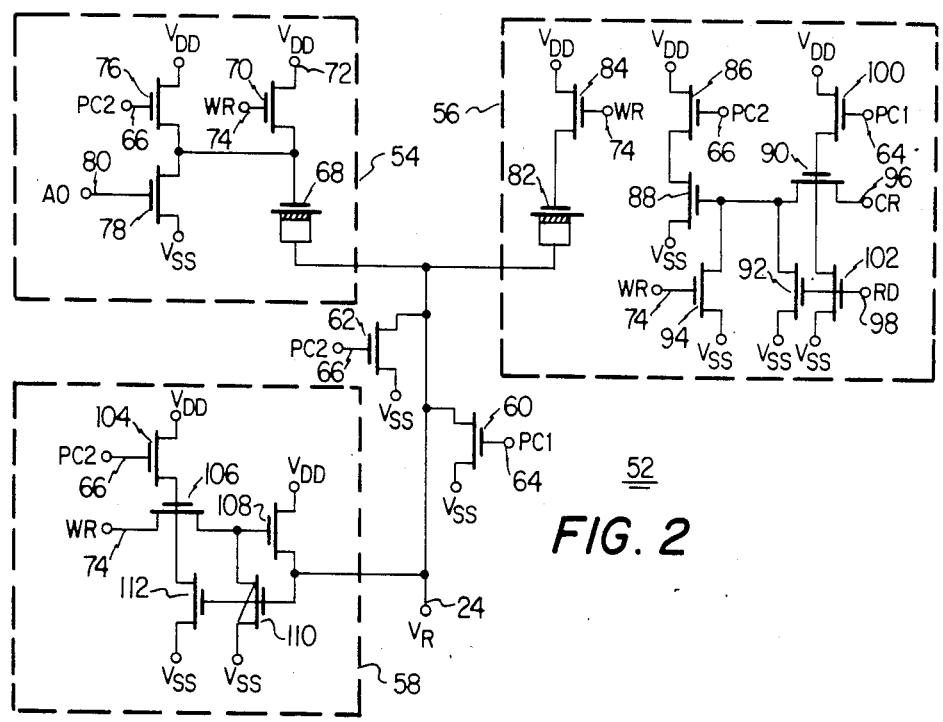
FIG. 2 is a schematic diagram of a reference voltage setting circuit for use with the sense amplifier of FIG. 1.

FIG. 2 is a schematic diagram of a circuit for helping to produce the reference voltage VR which appears on line 24 of FIG. 1. The reference circuit schematic diagram is shown generally as reference number 52. The circuit is comprised of three main sections, a first charge generation circuit 54, a second charge generation circuit 56, and a circuit 58 for pulling the reference voltage to a high voltage level. Also shown in FIG. 2 are two pulldown transistors 60 and 62, each of which have their drains connected to reference voltage lines 24 and their sources connected to VSS. The gate of pulldown transistor 60 is connected to a first precharge signal PC1 on line 64 and the gate of pulldown transistor 62 is connected to a second precharge signal PC2 on line 66.

Charge generation circuit 54 is comprised of four transistors, one of which acts as a capacitor. Capacitor transistor 68 has its source and drain connected together and to the reference voltage line 24. A pullup transistor 70 has its drain connected to a positive supply voltage VDD shown as reference number 72, its gate connected to an input signal WR on line 74, and its source connected to the gate of capacitor transistor 68. A second pullup transistor 76 is connected in parallel with pullup transistor 70, i.e. its drain is connected to VDD and its source is connected to the gate of capacitor transistor 68. The gate of pullup transistor 76 is connected to precharge signal PC2 on line 66. A pulldown transistor 78 has its drain connected to the gate of capacitor transistor 68, its source connected to the VSS pwoer supply and its gate connected to an input signal A0 on line 80.

The second current generation circuit 56 is comprised of nine transistors: A capacitor transistor 82 configured as a transistor having its drain and source connected together and connected to the reference voltage line 24. Capacitor transistors 68 and 82 in the preferred embodiment are depletion type transistors as indicated in the drawings by a solid band between the drain and source terminals of the devices. A pullup transistor 84 has its drain connected to VDD, its source connected to the gate of capacitor transistor 82, and its gate connected to the WR input on line 74. Another pullup transistor 86 is connected parallel with pullup transistor 84 in that the drain of pullup transistor 86 is connected to VDD and the source is connected to the gate of capacitor transistor 82. The gate of pullup transistor 86 is connected to precharge signal PC2 on line 66. A pulldown transistor 88 has its drain connected to the gate of capacitor transistor 82 and its source connected to VSS.

Connected to the gate of pulldown transistor 88 are the drains of three transistors, a gating transistor 90, and two pulldown transistors 92 and 94. The source of gating transistor 90 is connected to an input signal CR on line 96, and the sources of pulldown transistors 92 and 94 are connected to VSS. The gate of pulldown transistor 92 is connected to an input signal RD on line 98 and the gate of pulldown transistor 94 is connected to the WR input signal on line 74. The gate of gating transistor 90 is connected to the source of another pullup transistor 100 and to the drain of still another pulldown transistor 102. The drain of pullup transistor 100 is connected to VDD and its gate is connected to the precharge signal PC1 on line 64. The source of pulldown transistor 102 is connected to VSS and its gate is connected to RD on line 98.

The voltage pullup circuit 58 comprises five transistors, the first of which is a pullup transistor 104 having its drain connected to VDD and its gate connected to precharge signal PC2 on line 66. A gating transistor 106 has its gate connected to the source of pullup transistor 104, its source connected to input signal WR on line 74, and its drain connected to the gate of another pullup transistor 108. Transistor 108 has its drain connected to VDD and its source connected to the voltage reference line 24. Voltage reference line 24 in circuit 58 is also connected to the gates of pulldown transistors 110 and 112, the sources on both of which are connected to VSS. The drain of pulldown transistor 110 is connected to the gate of pullup transistor 108 while the drain of pulldown transistor 112 is connected to the gate of gating transistor 106.

Prior to a discussion of the operation of these circuits, it will be helpful to present a short discussion on the memory organization. The memory contains a plurality of sense amplifiers and only one of the circuits of FIG. 2. In each of the sense amplifiers certain signals are decoded based on the address inputs to the memory. However, some of these same signals, before they are decoded by the address inputs, are used in the reference voltage circuit. For example, signal RD00 on line 18 of FIG. 1 is the decoded signal RD on line 98 of FIG. 2. Similarly for signals WR00 and PC00. The WL00-WL31 signals are decoded from the CR signal. While the decoded and undecoded signals are slightly shifted in time, the difference is small and will be readily appreciated by those skilled in the art. Therefore in FIGS. 3 and 4 a single trace is used to indicate both the decoded and undecoded signals. Also in the preferred embodiment of the invention each sense amplifier is connected by a bit line to 32 memory cells, and one of every eight sense amplifiers is active during any one memory cycle.

Figure 3:
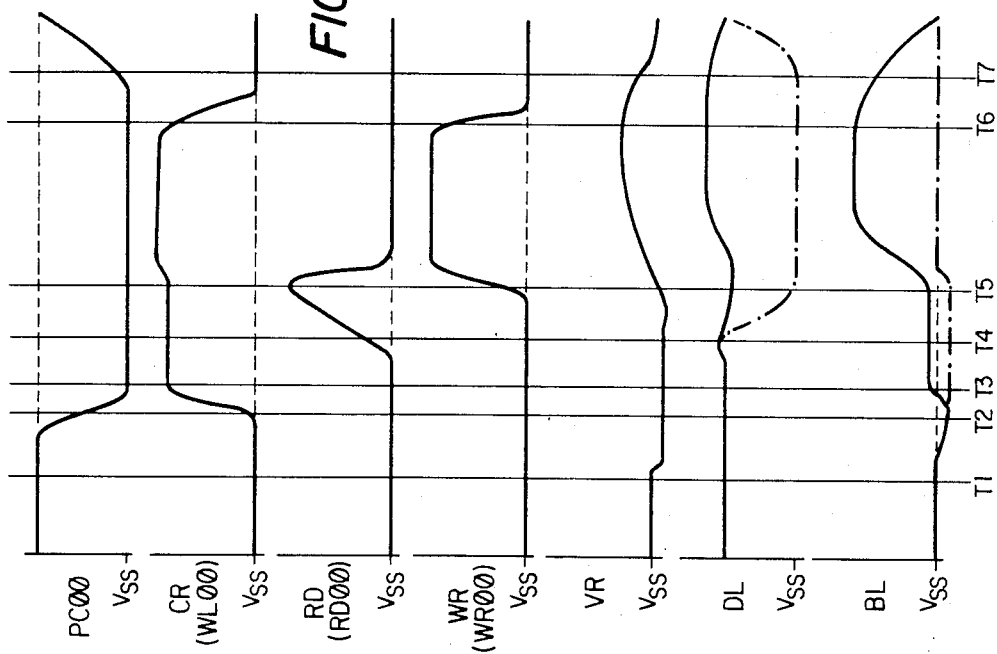
FIG. 3 is a timing diagram of voltages relevant to the circuit of FIG. 1.

In FIG. 3 a dashed line is used to indicate the voltage levels in unselected sense amplifiers. A broken line is used to indicate a voltage level on the digit line and bit line of a selected sense amplifier in which a logical zero has been read from a memory cell, while the solid line indicates the voltages present when a logical one is read from a memory cell.

The operation of the sense amplifier will be discussed with reference to the wave forms shown in FIG. 3 as they apply to the sense amplifier of FIG. 1. During the idle operation of the memory, before a memory cycle begins, precharge signal PC00 on line 22 and $PC_{DL}$ are at a high voltage level and all of the other input signals in FIG. 1 are at a low voltage level. Thus the gates of precharge transistors 51, 38 and 34 are high to make the precharge transistors conductive, thereby precharging digit line 26 to a high level, precharging bit line 16 to a low voltage through the WR00 signal on line 20 and precharging the gate of transistor 30 to a high voltage from DL on line 26. Since RD00 on line 18 is low, digit line transistor 32 is nonconductive, and since WR00 on line 20 is also low, write transistor 40 is nonconductive. Finally, since WL00 through WL31 on lines 48 and 50 are low, the memory cell access transistors 44 are also not conductive.

Figure 4:
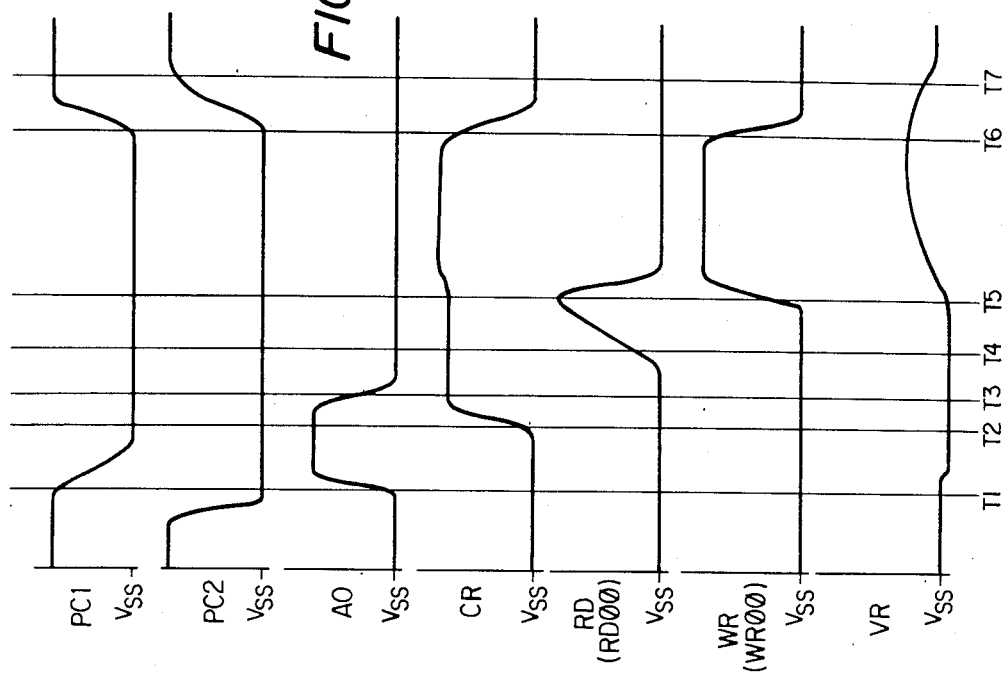
FIG. 4 is a timing diagram of voltages relevant to the circuit of FIG. 2.

At time T2 of FIGS. 3 and 4, PC00 on line 22 falls from a high level to the VSS level on the one-out-of eight selected sense amplifier. For the seven unselected sense amplifiers, PC stays at a constant high level throughout the memory cycle as indicated by the dashed line in FIG. 3. When PC00 falls to a low voltage level, transistors 38 and 34 which were previously conducting, become nonconductive, which isolates bit line 16 and the gate of amplifier transistor 30. When PC00 on line 22 falls it also causes a negative charge to be transferred across capacitor 42 onto the bit line 16. The result is that the bit lines on selected sense amplifiers are pulled to a slightly negative voltage prior to the time that the memory cell capacitor is connected to the bit line as shown in FIG. 3. As will be explained in more detail below, this slightly negative charge on the bit line provides added voltage margin for sensing an uncharged memory cell at the expense of losing some margin for sensing a charged memory cell.

Also at Time T2 but slightly after PC00 falls, one of the WL00 through WL31 lines of each selected sense amplifier rises in voltage to enable one of the access transistors 44 to in turn connect one of the memory cell capacitors 46 to bit line 16. At this time there is a charge sharing between the bit line capacitance and the memory cell capacitance, the resulting voltage of which is impressed on the gate of detector transistor 36.

This voltage either causes detector transistor 36 to become at least partially conductive and thereby pull the charge on the gate of transistor 30 towards the reference voltage on Line 24 or to leave the detector transistor 36 nonconductive and leave the charge on the gate of transistor 30 at a high voltage level. Detector transistor 36 can be regarded as a voltage comparator which detects if the bit line voltage is above or below a second reference voltage which is equal to one threshold voltage above the voltage on line 24. In the preferred embodiment this second reference voltage is at VSS due to the precharge operation described above. The solid lines in FIG. 3 show the bit line voltage and the digit line voltage which occur when a positive charge is stored on a memory cell capacitor. That is, immediately following time T2 the bit line voltage rises slightly above the VSS voltage level in an amount sufficient to cause detector transistor 36 to be conductive to in turn discharge the charge on the gate of transistor 30. Thus at time T4 when signal RD00 rises to a positive voltage, transistor 30 has become nonconductive and the positive voltage on RD00 line 18 is not transmitted to the gate of digit line transistor 32, and digit line 26 remains at a high voltage level throughout the memory cycle as shown in FIG. 3.

The broken line in FIG. 3 represents the voltages appearing if the stored capacitance in the memory cell was a logical zero, or an uncharged condition. That is bit line 16 would remain slightly negative when the RD00 signal rises, and as a result the digit line signal would be discharged by digit line transistor 32. As noted before, the RD00 signals on line 18 of unselected sense amplifiers stay at a low voltage level throughout the memory cycle.

At time T5, a WR00 signal on line 20 rises to write the information on the digit line 26 back onto the bit line 16. The charge is transferred from the digit line to the bit line by write transistor 40 during the write operation.

Also, time T5 is when new data is written into a memory cell by the simple operation of either forcing the digit line 26 to a low voltage level or a high voltage level during at least the portion of the memory cycle when the WR00 signal on line 20 is at a high level.

Shortly after time T5, RD00 goes low to turn off digit line transistor 32 which releases the digit line 26.

At time T6 the selected WL00-WL31 line returns back to the VSS level which traps the charge on the access memory cell capacitance 46 and prevents capacitor 46 from being affected by further changes in the bit line voltage. Also at time T6 the WR00 signal falls and write transistor 40 is made nonconductive, thereby isolating the bit line from the digit line. Finally, at time T7, the PC00 signal rises to thereby precharge the bit line to VSS potential and to precharge the gate of transistor 30 to the digit line potential to prepare for the next memory cycle.

FIG. 4 shows the voltage signals appearing in the circuit of FIG. 2. Referring to these voltage signals in which the times T1 through T7 correspond to times T1 through T7 of FIG. 3, prior to the beginning of the voltage cycle, signals PC1 on line 64 and PC2 of line 66 are at a high voltage level, while the rest of the input signals appearing in FIG. 2 are at a low voltage level. As a result of these voltage levels, the reference voltage on line 24 is held at VSS potential by transistors 60 and 62, the capacitor transistors 68 and 82 have a VDD to VSS voltage charge across them due to the actions of pullup transistor 76 and 86 which are conductive prior to a memory cycle. Also, transistors 100 and 104 are conductive to provide a positive charge on the gate terminals of the transistors 90 and 106 respectively.

At time T1 the signal PC2 on line 66 has dropped from a high to a low voltage level and the A0 signal on line 80 is rising. This combination causes the gate or VDD voltage on capacitor transistor 68 to begin to fall towards ground. Just after time T1 a signal PC1 on line 64 also falls which thereby releases the VR voltage on line 24 from being tied to the VSS potential. The falling of the VDD voltage on capacitor transistor 68 causes the voltage on the VR line 24 to begin to go below ground to a point where the detector transistors 36 on all of the sense amplifiers begin to conduct. In this manner the voltage on reference voltage line 24 drops to a level which is the average of the threshold voltages of detector transistors 36, since the gates of the detector transistors 36 during the time interval T1 through T2 are all at VSS potential. Thus detector transistors 36 become conductive enough to supply the charge for capacitor 68 of FIG. 2. The charge through the detector transistors 36 is supplied through the precharge transistors 34 which in turn is supplied from the digit line 26 which in turn tends to draw the voltage on digit line 26 down slightly from its high voltage level. Circuitry not shown in the drawings but well known in the art is used to replenish the voltage on the digit line prior to the RD signal rising to a positive level. Thus prior to the time T2 and the actual sensing operation, the reference voltage on line 24 for all the sense amps has been established.

At time T2, when the precharge signal PC00 on the selected sense amplifier falls to VSS, the bit line of the selected sense amplifiers has been pulled slightly negative and the selected WL00-WL31 signals rises to enable the access transistors 44 of the selected memory cells. Also at time T2 the CR signal in FIG. 2 on line 96 is transmitted through gating transistor 90 to the gate of pulldown transistor 88 to thereby pull the VDD charge on capacitor 82 towards VSS potential. This operation causes an additional negative charge to be placed on the reference voltage line 24. This new charge causes a VR voltage on line 24 of essentially one threshold voltage below ground since the bit lines on the seven unselected sense amplifiers remain at VSS potential. (The bit line of the selected sense amplifiers has been pulled slighlty negative.) This charge from capacitor 82 holds the voltage on reference voltage line 24 at a desirable fixed voltage during the operation of detector transistor 36 of a selected sense amplifier.

At time T3 the signal A0 on line 80 of FIG. 2 falls to thereby render transistor 78 nonconductive and thereby isolate capacitor 68 from any voltage source. Thus capacitor 68 is essentially removed from the circuit and does not disturb the operation of capacitor 82 of charge generation circuit 56. At time T4 signal RD00 on line 18 of FIG. 1 and also signal RD on line 98 of FIG. 2 rise. When RD00 rises to a high level, transistors 102 and 92 become conductive to in turn remove the charge from the gates of pulldown transistor 88 and 90. Removing the charge from pulldown transistor 88 causes pulldown transistor 88 to become nonconductive and to in turn isolate capacitor 82 from any VDD or VSS signals. As a result the reference voltage line 24 is undriven and tends to remain at its prior reference voltage level. However, by the time signal RD has occurred, the sensing of the voltage on the bit line through detector transistor 36 of the selected sense amplifiers has occurred, and the voltage appearing at the gate of amplifier transistor 30 of FIG. 1 has either been left at a high voltage potential or been drawn down to a level to make amplifier transistor 30 nonconductive.

Continuing the discussion with respect to FIG. 4, at time T5 the signal WR on line 74 rises to a voltage level above VDD. This in turn causes transistors 70, 84, 94 and 108 to become conductive. Transistor 70 and 84 by becoming conductive put a positive VDD voltage on capacitor 68 and 82 to in turn draw the reference voltage line 24 toward a positive voltage.

Pulldown transistor 94 is used to hold the gate of pulldown transistor 88 at a low voltage level when the RD signal of line 98 returns back to the low voltage level. Transistor 108, by becoming conductive, also pulls the reference voltage line 24 toward a VDD level. However, line 24 does not go completely to the VDD level due to the actions of pulldown transistors 112 and 110 which act to discharge the voltage on the gate of gating transistor 106 and the gate of pullup transistor 108 respectively. Transistor 110 in the preferred embodiment has a threshold voltage higher than the other transistors, as indicated by the diagonal line in pulldown transistor 110 in FIG. 2. The result of transistors 108 and 110 acting together is to provide a voltage on the reference voltage line 24 which is high enough to insure that the voltage level on the gate of transistor 30 is greater than one threshold which, in turn, insures that transistor 30 is conductive and the gate of transistor 32 will be at the same voltage as line 18 RD00. This makes transistor 32 nonconductive since RD00 line 18 is at ground potential at this time. Thus transistor 32 will not load digit line 26 if a high level is being written into the cell.

At time T6 the WR signal on line 74, which is essentially coincident with the WR00 signal, returns to ground potential at approximately the same time that the PC2 signal on line 66 returns to the positive voltage level to in turn hold the gates of transistors 68 and 82 at a high voltage level corresponding to VDD. Finally, at time T6 when PC00 on line 22 rises, the signal PC1 on line 64 also rises at approximately the same time to thereby preset the reference voltage circuit for the next memory cycle.

It will be understood that before a cell is attached to the bit line 16 the gate to source voltages on transistors 36 of the selected sense amplifiers will be less than the threshold voltages of transistors 36 since the reference voltage on line 24 is adjusted to approximately one threshold voltage below VSS as discussed above and the bit lines of the selected sense amplifiers have been coupled below VSS. The net result is to add some margin to the sensing of an uncharged memory cell in case a small positive charge were present in the memory cell or on a bit line, but to also decrease the positive level threshold by a like amount. This is an advantageous tradeoff since the high voltage level or charge voltage level is easier to detect with the present sense amplifier than the low voltage level. In the preferred embodiment it is anticipated that a reliable signal will be provided to the gate of detector transistor 36 before the word line has reached its high level of VDD and full charge transfer has occurred from the memory cell to the bit line thus allowing the memory access time to be shortened by a like amount. As will be understood by those skilled in the art, the fall time of PC00 on line 22 and/or the size of capacitor 42 can be adjusted to provide an adjustment of the negative voltage on bit line 16 and thereby select and trade off the positive charge margins against the uncharged margins of the sense amplifier.

Advantageously the present sense amplifier, due to its small number of transistors and a corresponding small amount of chip area required for implementation, enables a large number of sense amplifiers with a corresponding relatively few number by memory cells for each sense amplifier. The result has several advantages such as providing a relatively fast sense amplifier arrangement since the bit line connecting the memory cells and the sense amplifier is relatively short, and thereby has relatively low capacitance as compared to prior art memory bit lines. This low capacitance also means that the relative signal produced by each memory cell capacitance is large as compared to prior art circuits. Stated another way, the present circuit can operate with smaller memory capacitors and still provide reliable reading of the memory cells.

The sense amplifier of the present invention is faster than prior art cross-coupled sense amplifiers because the precharge is stablished prior to the beginning of the memory cycle, and because the sense amplifier provides a positive pulldown on the digit line thus eliminating the need for a second sense amplifier. Moreover, the precharge signals are faster and settle to a predictable voltage because the critical precharge signal on bit line 16 is at the VSS voltage supply (ground potential in the preferred embodiment) and held there by a transistor which has a relatively large gate to source voltage. Thus the critical precharge voltage settles rapidly and settles to a relatively constant voltage for each of the sense amplifiers throughout the memory chip. Moreover the column decoder circuitry can be coupled to the digit line 26 before the memory cell sensing operation.

Although FIG. 1 shows a single cell sense amplifier, it will be appreciated that many of the sense amplifiers in the preferred embodiment of the memory chip are actually dual sense amplifiers which share a common amplifier transistor 30, a common digit line transistor 32 and a common first precharge transistor 34. Therfore it is evident that only one-half of the dual sense amplifier operates during any one memory cycle. In this embodiment the gate of the first precharge transistor 34 is still connected to the gate of the second precharge transistor 38 and to the gate of capacitor transistor 42. However the WR00 signal on line 20 is only active for one-half of the dual sense amplifier at a time, and only one word line for each dual sense amplifier is active during any one cycle.

Although the invention has been described in part by making detailed reference to certain specific embodiments, such details are intended to be, and will be understood to be, instructive rather than restrictive. It will be appreciated by those in the art that many variations may be made in the structure and mode of operation without departing from the scope and spirit of the invention as described in the teachings contained herein.

I claim:

1. Apparatus for sensing and amplifying the voltage produced by memory cells (12,14), comprising:
   (a) a plurality of input terminals (16) each adapted to receive a signal (BL) from a memory cell (12, 14);
   (b) a plurality of detector transistors (36), each responsive to a reference voltage ($V_R$), for detecting the voltage at a respective input terminal (16) and for providing a detector output signal; and
   (c) means (54, 56, 58, 68), selectively connected to a power supply potential ($V_{DD}$) and coupled to a reference voltage terminal (24) of each of said detector transistors (36),
      said means (68) responding to disconnection from said power supply potential by reducing said reference voltage sufficiently to render all of said detector transistors (36) conductive, thereby establishing, prior to a sensing operation, said reference voltage at a level which is an average of threshold voltages of all of said detector transistors (36).

2. Apparatus as set forth in claim 1 wherein
the means (54, 56, 58) for establishing the reference voltage (24) includes
means (68) for receiving a predetermined current charge from the source terminals (24) of the detector transistors (36).

3. Apparatus as set forth in claim 2, wherein
said means for receiving a current charge comprises a capacitor (68) having a first terminal connected to said source terminal (24) of said detector transistor (36) and a second terminal selectively connectable to a power supply potential ($V_{DD}$).

4. Apparatus as set forth in claim 2 further including:
   (a) a plurality of first switching means (30) each respectively connected to an output (PCN) of an associated detector transistors (36) for selectively either
      passing a portion of a read signal (RD00) to an output node (OPN) of the first switching means (30) or
      inhibiting substantially all of the read signal (RD00) from propagating to the output node of the first switching means (30) in response to an output of the detector transistor (36); and
   (b) a plurality of second switching means (32), ach respectively coupled between an associated first switching means (30) and a digit line (26), for providing alternatively either a low impedance or a high impedance between the digit line (26) and a reference potential (28) in response to the signal at the output node (OPN) of the first switching means (30).

5. Apparatus as set forth in claim 4, wherein said means (54, 56, 58, 68) for establishing the reference voltage ($V_R$) comprises a first charge generation circuit (54) which supplies a charge at said reference voltage terminals (24) to bias said detector transistors (36) into conduction during establishment of said reference voltage, a second charge generation circuit (56) which applies a constant, below-ground-level voltage to said reference voltage terminals during the operation of a detector transistor (36) of a selected sense amplifier on said bit line signal, and a reference voltage pull-up circuit (58) which, when a high bit line signal is being sensed, pulls up the voltage level on said reference voltage terminals (24) sufficiently to assure conduction of said first switching means (30) and non-conduction of said second switching means, thereby preventing loading on said digit line, each of said circuit being connected to a reference voltage terminal (24) of each detector transistor (36).

6. Apparatus as set forth in claim 5, wherein said first charge generation circuit (54) includes a capacitor means (68) having a first terminal selectively connected to a power supply potential ($V_{DD}$) and a second terminal connected to said reference voltage terminal (24);

said capacitor means (68) responding to disconnection from said power supply potential by reducing said reference voltage sufficiently to render all of said detector transistors (36) conductive, thereby establishing said reference voltage at a level which is an average of threshold voltages of all of said detector transistors (36).

7. Apparatus for sensing the signals in a plurality of memory cells in a memory comprising:
(a) a first plurality of amplifiers, each amplifier comprising detection means coupled to a plurality of memory cells and responsive to a signal from any one of the plurality of memory cells, and also responsive to a reference signal for detecting the signal from one of the memory cells;
(b) current means for drawing a preselected amount of current through the detector means of the first plurality of sense amplifiers; and
(c) a second plurality of sense amplifiers which is a subset of the first plurality of sense amplifiers, and which are unselected for a particular first combination of addresses to the memory and which supply current to the current means through the detection means of each of the second plurality of sense amplifiers to set the reference voltage level used by the sense amplifiers selected by the first combination of addresses to the memory.

8. Apparatus as set forth in claim 7 further including:
(a) a first switching means connected to the detecting means for either passing a portion of a read signal to an output node of the first switching means, or for inhibiting substantially all of the read signal from propagating to the output node of the first switching means in response to the detection means; and
(b) a second switching means coupled between the first switching means and a digit line for providing either a low impedance or a high impedance between the digit line and a reference potential in response to the signal at the output node of the first switching means.

9. A sense amplifier comprising:
(a) a first conductive path connected to a plurality of memory cells;
(b) means for precharging the conductive path to a predetermined voltage level;
(c) threshold detecting circuitry connected to the conductive path and providing an output signal in response to the voltage appearing on the conductive path;
(d) a first switching means connected to the threshold detecting circuit for either passing a portion of a read signal to an output node of the first switching means, or for inhibiting substantially all of the read signal from propagating to the output node of the first switching means in response to the output signal of the threshold detection circuit; and
(e) a second switching means coupled between the first switching means and a digit line for providing either a low impedance or a high impedance between the digit line and a reference potential in response to the signal at the output node of the first switching means.

10. A memory sense amplifier as recited in claim 9 further comprising a third switching means coupled between the digit line and the bit line for transferring charge between the digit line and the bit line for writing data into a selected memory cell.

11. A memory sense amplifier coupled to a plurality of memory cells comprising:
(a) a first field effect transistor having gate, drain and source terminals wherein a gate terminal is connected to a bit line which in turn is connected to a plurality of memory cells, and a source terminal connected to a reference voltage;
(b) a second transistor having gate, drain and source terminals wherein the gate terminal thereof is connected to the drain terminal of said first transistor; and a source terminal of said second transistor connected to a read signal;
(c) a third transistor having a gate, drain and source wherein the gate terminal thereof is connected to the drain of said second transistor, the source terminal of said third transistor connected to a reference potential and the drain terminal of said third transistor connected to a digit line;
(d) first precharge means for precharging the bit line to the reference potential;
(e) a second precharge means for precharging a gate of the second transistor to a first voltage potential; and
(f) capacitance means for coupling charge from a precharge signal to the bit line to thereby pull the voltage level of the bit line below the voltage of the reference potential.

12. A method for sensing the data stored in a memory cell (12, 14) having a transistor (44) and a capacitor (42), comprising the steps of:
(a) precharging a first conductive path (16) coupled to the memory cell (12, 14) to a ground potential ($V_{SS}$);
(b) enabling (44) the memory cell (12, 14) to permit the transfer of charge between the first conductive path (16) and the capacitor (46) of the memory cell (12, 14);

(c) detecting the signal resulting from said charge transfer on the first conductive path (16) with a single transistor (36), which transistor in turn alternatively essentially discharges or leaves essentially fully charged a precharged node (PCN), depending on the level of said signal;

(d) alternatively charging or leaving uncharged a second conductive path (31) depending respectively on whether the precharged node (PCN) is in a charged state or in a discharged state; and (e) discharging or leaving essentially fully charged a digit line (26) depending upon whether said second conductive path (31) is in a charged, or in a discharged, state, respectively.

13. A method for sensing the data stored in a memory cell (12, 14), comprising the steps of:

(a) precharging a first conductive path (16), namely a bit line, to a predetermined voltage;

(b) coupling source terminals of detector transistors (36) of a plurality of sense amplifiers (10) to a reference voltage line (24);

(c) coupling (44) the charge stored (46) in the memory cell (12,14) to the bit line (16), thereby generating a bit line voltage signal;

(d) detecting whether the signal voltage on the bit line (16) is above or below a threshold voltage at which an associated one of said detector transistors (36) conducts; and (e) discharging or leaving essentially charged a precharged node (PCN), depending, respectively, upon whether said signal voltage is above or below said threshold voltage, charging or leaving uncharged a second conductive path (31), connected to a gate of a pull-down transistor (32) coupled to a digit line (26), depending respectively on whether the precharged node (PCN) is in a charged state or in a discharged state, thereby discharging or leaving essentially fully charged said digit line (26) depending upon whether said second conductive path (31) is in a charged, or in a discharged, state, respectively.

* * * * *